(12) United States Patent
Vattakandy et al.

(10) Patent No.: US 10,489,159 B2
(45) Date of Patent: Nov. 26, 2019

(54) PIPELINED DECOMPRESSION OF SLIDING WINDOW COMPRESSED DATA

(71) Applicant: Microsoft Technology Licensing, LLC, Redmond, WA (US)

(72) Inventors: Amar Vattakandy, Longmont, CO (US); Michael J. Erickson, Fort Collins, CO (US); Robert W. Havlik, Fort Collins, CO (US); Derek E. Gladding, Pacifica, CA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 222 days.

(21) Appl. No.: 15/609,759

(22) Filed: May 31, 2017

(65) Prior Publication Data

US 2018/0173642 A1 Jun. 21, 2018

Related U.S. Application Data

(60) Provisional application No. 62/437,505, filed on Dec. 21, 2016.

(51) Int. Cl.
*G06F 12/00* (2006.01)
*G06F 9/38* (2018.01)
(Continued)

(52) U.S. Cl.
CPC .......... *G06F 9/3867* (2013.01); *G06F 3/0608* (2013.01); *G06F 3/0628* (2013.01);
(Continued)

(58) Field of Classification Search
None
See application file for complete search history.

(56) References Cited

U.S. PATENT DOCUMENTS

| 4,053,871 A | 10/1977 | Vidalin et al. |
| 4,384,291 A * | 5/1983 | Lewis ................ G01S 13/286 342/194 |

(Continued)

OTHER PUBLICATIONS

"Non Final Office Action Issued in U.S. Appl. No. 15/640,079", dated Apr. 4, 2019, 11 Pages.
(Continued)

*Primary Examiner* — Midys Rojas
(74) *Attorney, Agent, or Firm* — Alleman Hall Creasman & Tuttle LLP (57) ABSTRACT

Decompressing sliding window compressed data requires reference to previously decompressed character sequences. Previously decompressed data is stored in a history buffer to satisfy these 'back references.' As each decompressed/decoded character is emitted, it is stored in this history buffer. Thus, for each decompressed character that is emitted, the history buffer may need to be accessed at least twice—once to retrieve the backreference, and once to store the emitted character. A pipeline architecture is disclosed that stores decompressed characters in a write queue that coalesces eight or more emitted characters before they are stored in the history buffer memory. This reduces collisions between accessing the history buffer memory to retrieve the backreferences and the storing of the emitted character. This also allows the use of a single-ported memory which is less expensive than a multi-ported memory.

20 Claims, 9 Drawing Sheets

(51) Int. Cl.
*G06F 3/06* (2006.01)
*G06F 13/16* (2006.01)
*G06F 12/0855* (2016.01)
*G06F 12/0846* (2016.01)
*G06F 12/0844* (2016.01)
*H03M 7/30* (2006.01)

(52) U.S. Cl.
CPC ...... *G06F 12/0844* (2013.01); *G06F 12/0846* (2013.01); *G06F 12/0855* (2013.01); *G06F 12/0857* (2013.01); *G06F 13/1642* (2013.01); *H03M 7/30* (2013.01); *H03M 7/3086* (2013.01); *H03M 7/6023* (2013.01)

(56) References Cited

U.S. PATENT DOCUMENTS

| | | |
|---|---|---|
| 5,699,117 A | 12/1997 | Uramoto et al. |
| 6,591,384 B1 | 7/2003 | Chou |
| 7,243,165 B2 | 7/2007 | Kravec et al. |
| 9,159,114 B2 | 10/2015 | Dewangan et al. |
| 2005/0243818 A1 | 11/2005 | Foglar et al. |
| 2009/0232482 A1 | 9/2009 | Ju |
| 2013/0099947 A1 | 4/2013 | Dickie et al. |
| 2013/0290646 A1* | 10/2013 | Greenwood ............ H04L 49/90 711/149 |
| 2014/0156790 A1 | 6/2014 | Gopal et al. |
| 2018/0081591 A1* | 3/2018 | Maheshwari ......... G06F 3/0656 |

OTHER PUBLICATIONS

"Non Final Office Action Issued in U.S. Appl. No. 15/640,146", date May 1, 2019, 05 Pages.

* cited by examiner

| AddrGen | CopyAcross | Skid | Check WQ (Hit) | HB Read | Align |
|---|---|---|---|---|---|
| Ctrl Bus 121a | Ctrl Bus 131a | Ctrl Bus 136a | Ctrl Bus 141a | Ctrl Bus 151a | Ctrl Bus 161a |
| 3: PTR: Rd Addr = 2, Wr Addr = 19 | 3: PTR: Rd Addr = 2, Wr Addr = 19 | 3: PTR: Rd Addr = 2, Wr Addr = 19 | 3: Pass: RdLane = 2, Wr Addr = 19 | 3: Pass: RdLane = 2, Wr Addr = 19 | 3: Write: Lane = 3, Wr Addr = 19 |
| 2: PTR: Rd Addr = 16, Wr Addr = 18 | 2: LIT, WrLane = 2, WrAddr = 18 | 2: LIT, WrLane = 2, WrAddr = 18 | 2: LIT, WrLane = 2, WrAddr = 18 | 2: LIT, WrLane = 2, WrAddr = 18 | 2: Write: Lane = 2, WrAddr = 18 |
| 1: LIT, WrLane = 1, WrAddr = 17 | 1: LIT, WrLane = 1, WrAddr = 17 | 1: LIT, WrLane = 1, WrAddr = 17 | 1: LIT, WrLane = 1, WrAddr = 17 | 1: LIT, WrLane = 1, WrAddr = 17 | 1: Write: Lane = 1, WrAddr = 17 |
| 0: LIT, WrLane = 0, WrAddr = 16 | 0: LIT, WrLane = 0, WrAddr = 16 | 0: LIT, WrLane = 0, WrAddr = 16 | 0: LIT, WrLane = 0, WrAddr = 16 | 0: LIT, WrLane = 0, WrAddr = 16 | 0: Write: Lane = 0, WrAddr = 16 |
| WrData Bus 121b | WrData Bus 131b | WrData Bus 136b | WrData Bus 141b | WrData Bus 151b | History Buf WrData Bus 262b |
| 3: XX | 3: XX | 3: XX | 3: XX | 3: XX | 3: 0xDD |
| 2: XX | 2: 0xAA | 2: 0xAA | 2: 0xAA | 2: 0xAA | 2: 0xAA |
| 1: 0xBB | 1: 0xBB | 1: 0xBB | 1: 0xBB | 1: 0xBB | 1: 0xBB |
| 0: 0xAA | 0: 0xAA | 0: 0xAA | 0: 0xAA | 0: 0xAA | 0: 0xAA |
| | | | RdData Bus 141c | RdData Bus 151c | |
| | | | 3: XX | 3: XX | |
| | | | 2: 0xDD | 2: 0xDD | |
| | | | 1: XX | 1: XX | |
| | | | 0: XX | 0: XX | |
| Read and write addresses are Calculated. Literals are copied to WrData Bus | Back Reference in Lane 2 is re-written as LIT because the data being referenced is written in the same cycle | No change in Control or Data | | | Read Data Lane 2 is copied to write lane 3. Output Fifo data is aligned to LSB |

FIGURE 5

| AddrGen | CopyAcross | skid | Check WQ (Miss) | HB Read | Align |
|---|---|---|---|---|---|
| Ctrl Bus 121a | Ctrl Bus 131a | Ctrl Bus 136a | Ctrl Bus 141a | Ctrl Bus 151a | Ctrl Bus 161a |
| 3 | PTR: Rd Addr = 2, Wr Addr = 19 | 3 | PTR: Rd Addr = 2, Wr Addr = 19 | 3 | PTR: Rd Addr = 2, Wr Addr = 19 | 3 | PTR: Rd Addr = 2, Wr Addr = 19 | 3 | Pass: RdLane = 2, Wr Addr = 19 | 3 | Write: Lane = 3, Wr Addr = 19 |
| 2 | PTR: Rd Addr = 16, Wr Addr = 18 | 2 | LIT, WrLane = 2, WrAddr = 18 | 2 | LIT, WrLane = 2, WrAddr = 18 | 2 | LIT, WrLane = 2, WrAddr = 18 | 2 | LIT, WrLane = 2, WrAddr = 18 | 2 | Write: Lane = 2, WrAddr = 18 |
| 1 | LIT, WrLane = 1, WrAddr = 17 | 1 | LIT, WrLane = 1, WrAddr = 17 | 1 | LIT, WrLane = 1, WrAddr = 17 | 1 | LIT, WrLane = 1, WrAddr = 17 | 1 | LIT, WrLane = 1, WrAddr = 17 | 1 | Write: Lane = 1, WrAddr = 17 |
| 0 | LIT, WrLane = 0, WrAddr = 16 | 0 | LIT, WrLane = 0, WrAddr = 16 | 0 | LIT, WrLane = 0, WrAddr = 16 | 0 | LIT, WrLane = 0, WrAddr = 16 | 0 | LIT, WrLane = 0, WrAddr = 16 | 0 | Write: Lane = 0, WrAddr = 16 |
| WrData Bus 121b | WrData Bus 131b | WrData Bus 136b | WrData Bus 141b | WrData Bus 151b | History Buf WrData Bus 262b |
| 3 | XX | 3 | XX | 3 | XX | 3 | XX | 3 | XX | 3 | 0xDD |
| 2 | XX | 2 | 0xAA | 2 | 0xAA | 2 | 0xAA | 2 | 0xAA | 2 | 0xAA |
| 1 | 0xBB | 1 | 0xBB | 1 | 0xBB | 1 | 0xBB | 1 | 0xBB | 1 | 0xBB |
| 0 | 0xAA | 0 | 0xAA | 0 | 0xAA | 0 | 0xAA | 0 | 0xAA | 0 | 0xAA |
| | | | | RdData Bus 141c | RdData Bus 151c | |
| | | | | 3 | XX | 3 | XX | |
| | | | | 2 | XX | 2 | 0xDD | |
| | | | | 1 | XX | 1 | XX | |
| | | | | 0 | XX | 0 | XX | |
| Read and write addresses are Calculated. Literals are copied to WrData Bus | Back Reference in Lane 2 is re-written as LIT because the data being referenced is written in the same cycle | No change in Control or Data | | | Read Data Lane 2 is copied to write lane 3. Output Fifo data is aligned to LSB |

PIPELINED DECOMPRESSION OF SLIDING WINDOW COMPRESSED DATA

RELATED APPLICATIONS

This application claims the benefit of U.S. Application Ser. No. 62/437,505, filed Dec. 21, 2016, the contents of which are incorporated herein by reference in its entirety for all purposes.

BACKGROUND

In the field of data processing systems, it is desirable to reduce the size of data files to conserve memory, storage space, and to more efficiently utilize transmission bandwidth. Data compression is often employed to reduce the size of data. In particular, Lempel-Ziv (LZ) data compression techniques are the basis for many modern compression standards.

SUMMARY

Examples discussed herein relate to an integrated circuit for decompressing a sliding window compression scheme. The integrated circuit includes a history buffer memory. This history buffer memory holds data corresponding to a sliding window of the sliding window compression scheme. The history buffer memory includes a plurality of single-ported memory banks. Each of the plurality of single-ported memory banks is configured so that at most one of a read or write operation is performed concurrently by a respective single-ported memory bank. The integrated circuit also includes a write queue to receive write data to be written to the history buffer memory. The write queue coalesces a write operations to reduce write operations made to the single-ported memory banks. The write queue responds to read operations with corresponding data that is waiting in the write queue before being written to the history buffer memory. The history buffer memory is not read for the corresponding data if the write queue responds with the corresponding data.

In another example, a method of maintaining sliding window data for decompressing a sliding window compression scheme includes reading blocks of sliding window data from a history buffer memory holding data corresponding to a sliding window of the sliding window compression scheme. The history buffer memory includes a plurality of single-ported memory banks. Each of the plurality of single-ported memory banks is configured so that at most one of a reading of a first block of sliding window data and a writing of a second block of sliding window data can be performed concurrently by a respective single-ported memory bank. The method also includes coalescing write data in a write data queue. The coalesced write data is written to the history buffer memory in write data blocks. The method also includes providing, by the write data queue and in response to a read request, write data stored in the write data queue that corresponds to the address of the read request. If the write data queue does not provide write data stored in the write data queue corresponding to the address of the read request, data read from the history buffer memory that corresponds to the read request is provided.

In another example, a method of decompressing data compressed according to a sliding window compression scheme includes receiving, by a first pipeline stage, a first block of compressed data. The first block of compressed data includes a plurality of symbols representing at least one literal and at least one backreference. The first pipeline stage computes a respective address for each symbol of the plurality of symbols. The respective address for each symbol corresponds to a respective location in a history buffer memory where a respective atomic data unit associated with the respective symbol is to be stored in the history buffer memory after the respective symbol is decoded. The history buffer memory stores a first sliding window of atomic data units that have been previously decoded. A second pipeline stage queries a write queue to determine whether a first atomic data unit corresponding to a first symbol of the plurality of symbols is being stored in the write queue. In response to determining the first atomic data unit is stored in the write queue, the first atomic data unit is sent to the second pipeline stage. In response to determining the first atomic data unit is not being stored in the write queue, a third pipeline stage retrieves the first atomic data unit from the history buffer memory.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

In order to describe the manner in which the above-recited and other advantages and features can be obtained, a more particular description is set forth and will be rendered by reference to specific examples thereof which are illustrated in the appended drawings. Understanding that these drawings depict only typical examples and are not therefore to be considered to be limiting of its scope, implementations will be described and explained with additional specificity and detail through the use of the accompanying drawings.

DETAILED DESCRIPTION OF THE EMBODIMENTS

Examples are discussed in detail below. While specific implementations are discussed, it should be understood that this is done for illustration purposes only. A person skilled in the relevant art will recognize that other components and configurations may be used without parting from the spirit and scope of the subject matter of this disclosure. The implementations may be a machine-implemented method, a computing device, or an integrated circuit.

Lempel-Ziv (LZ) compression techniques are based on a dictionary of character (or symbol) sequences that have already been encountered in an input data stream. When a sequence of characters is being compressed, and that character sequence has already been encountered and stored in the history buffer (a.k.a., dictionary), the compression scheme outputs reference value or token to be output to the compressed data. The reference value identifies the string in the history buffer that is identical to the sequence of characters being compressed. Characters that are not in the dictionary are tagged and output as literals without a reference to the history buffer. Decompressing LZ compressed data requires reference to previously decompressed character sequences. Previously decompressed data is stored in a history buffer to satisfy these 'back references.' As each decompressed/decoded character is emitted, it is stored in this history buffer. Thus, for each decompressed character that is emitted, the history buffer may need to be accessed at least twice—once to retrieve the backreference, and once to store the emitted character. In an embodiment, a pipeline architecture is used that stores decompressed characters in a write queue that coalesces eight or more emitted characters before they are stored in the history buffer memory. This and the memory banking described herein reduces collisions between accessing the history buffer memory to retrieve the backreferences and the storing of the emitted character. This also allows the use of a single-ported memory which is less expensive than a multi-ported memory.

Figure 1:
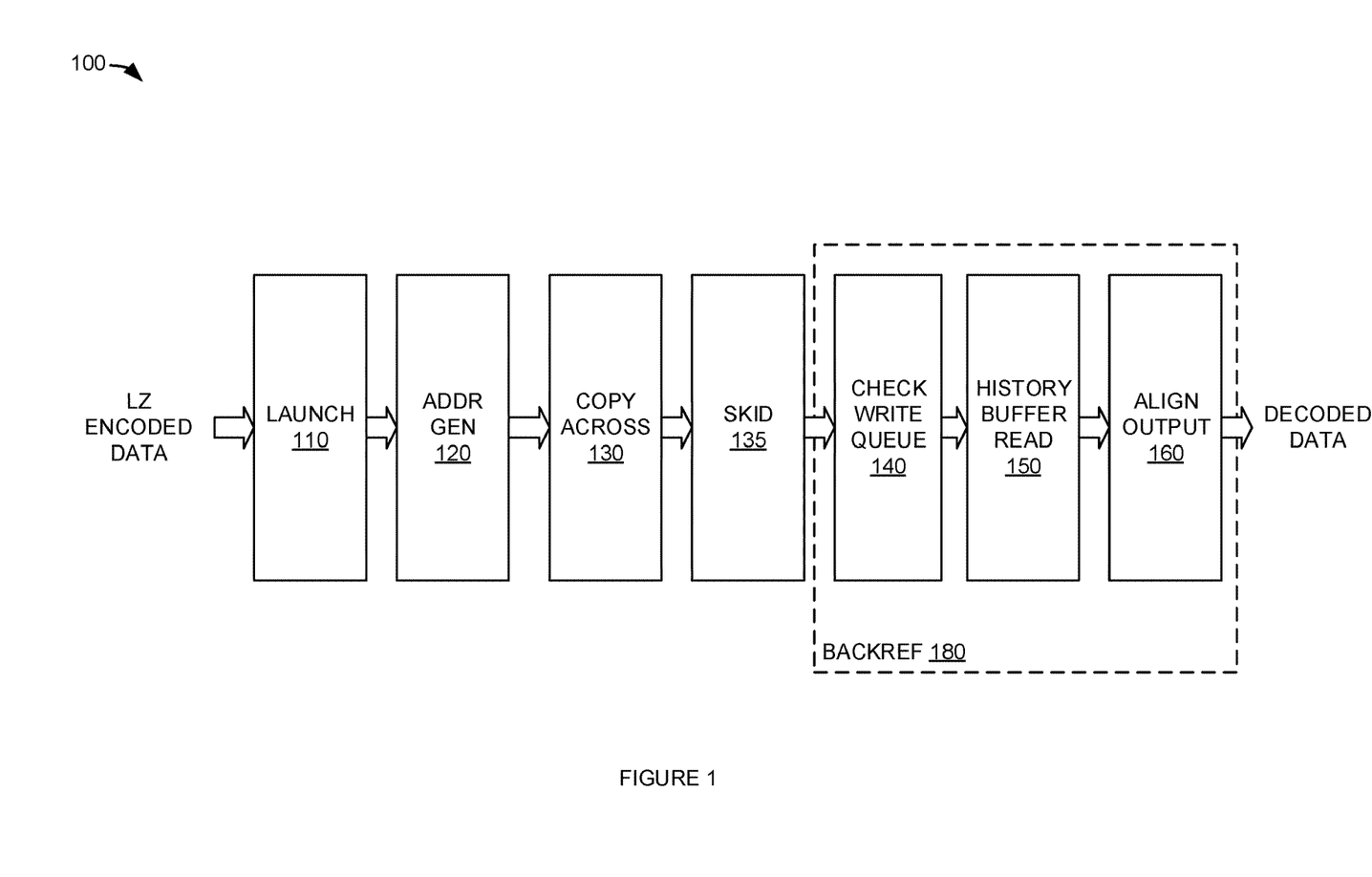
FIG. 1 is a block diagram illustrating pipeline stages to decompress sliding window data compression schemes.

FIG. 1 is a block diagram illustrating pipeline stages to decompress sliding window data compression schemes. In FIG. 1, pipelined decompression system 100 includes launch pipeline stage (launch) 110, address generation pipeline stage (AddrGen) 120, copy across pipeline stage (copy) 130, (optional) skid stage 135, check write queue pipeline stage (Check WQ) 140, history buffer read (FIB read) 150, and output align pipeline stage (Align) 160. Back reference and output stages (BackRef) 180 include check write queue pipeline stage 140, history buffer read 150, and output align pipeline stage 160.

LZ encoded data is received by launch stage 110. The output of launch 110 (e.g., pointers/backreferences, literals) is provided to address generation 120. The output of address generation 120 (control, addresses, and data) is provided to copy across 130. The output of copy across 130 is provided to an optional skid stage 135. If skid stage 135 is present, the output of skid stage 135 is provided to check write queue 140. If skid stage 135 is not present, the output of copy across 130 is provided to check write queue 140.

An input stream of symbols containing a set of literals (abbreviated herein as Lit or LIT) or back-references are expanded into an output stream by applying the appropriate transformations via the pipeline stage. Literals are copied to the output verbatim and back-references containing a pointer (e.g., length and offset—abbr. PTR) are copied from previously observed symbols obtained from a history buffer memory.

Referring to FIG. 1, launch stage 110 breaks up operations into groups of operations that can be performed by the subsequent pipeline stages in one cycle. For example, launch 110 may pass up to four literal operations and no more than one backreference to address generation 120. Address generation 120 generates address and control signals for the remainder of the pipeline. The addressees generated by address generator 120 may include write addresses where the received literals are to be stored in the history buffer memory. The addresses generated by address generator 120 may also include a read address in the history buffer memory where a backreferenced character is to be read from, and a write addresses where the backreference is to be written to. Write addresses are in an ascending order. Address generator 120 also forwards the received literal(s) to copy across 130.

Copy across 130 manages read-after-write hazards that may occur within the same cycle. Since multiple symbols can be processed in every cycle, copy across 130 takes care of the situations where a literal that is being processed by a given pipeline stage is referenced by a subsequent backreference that is also being processed by that same pipeline stage. In this case, the backreference is converted to a literal and the value copied across from the input of copy across 130 to the output of copy across 130. Optional skid buffer 135 may be present to stop the propagation of timing of stall logic backward from the subsequent back reference stages 180.

Check write queue 140 checks to see if any of the received read addresses is currently being stored in the write queue (called a read 'hit'.) If there is at least one hit, the respective data from the write queue is passed to the history buffer read 150 stage. Control signals are also output by write queue check 140 so that a read from the history buffer memory is not performed to obtain the data that was already supplied from the write queue.

Reads in that do not hit the write queue are read from the history buffer memory by history buffer read 150. The data read from the history buffer memory is merged, in the appropriate location, with any data from the previous check write queue 140 stage.

The align stage 180 combines the merged data (which contains results of reads from write queue or the history buffer memory) with the literals that have been passed through the previous pipeline stages (i.e., literals, either original or copied across) to form a block of aligned output data. The aligned output data is also forwarded to the write queue so it may be written to the history buffer memory at a later time. The aligned output data is also aligned (lowest byte aligned to the least significant byte of the output bus) as an output of system 100. The write queue subsequently writes the oldest data it holds into the history buffer when an operation on the appropriate history buffer memory bank is available. A memory bank is available when no reads are scheduled for that bank in a cycle.

Figure 2:
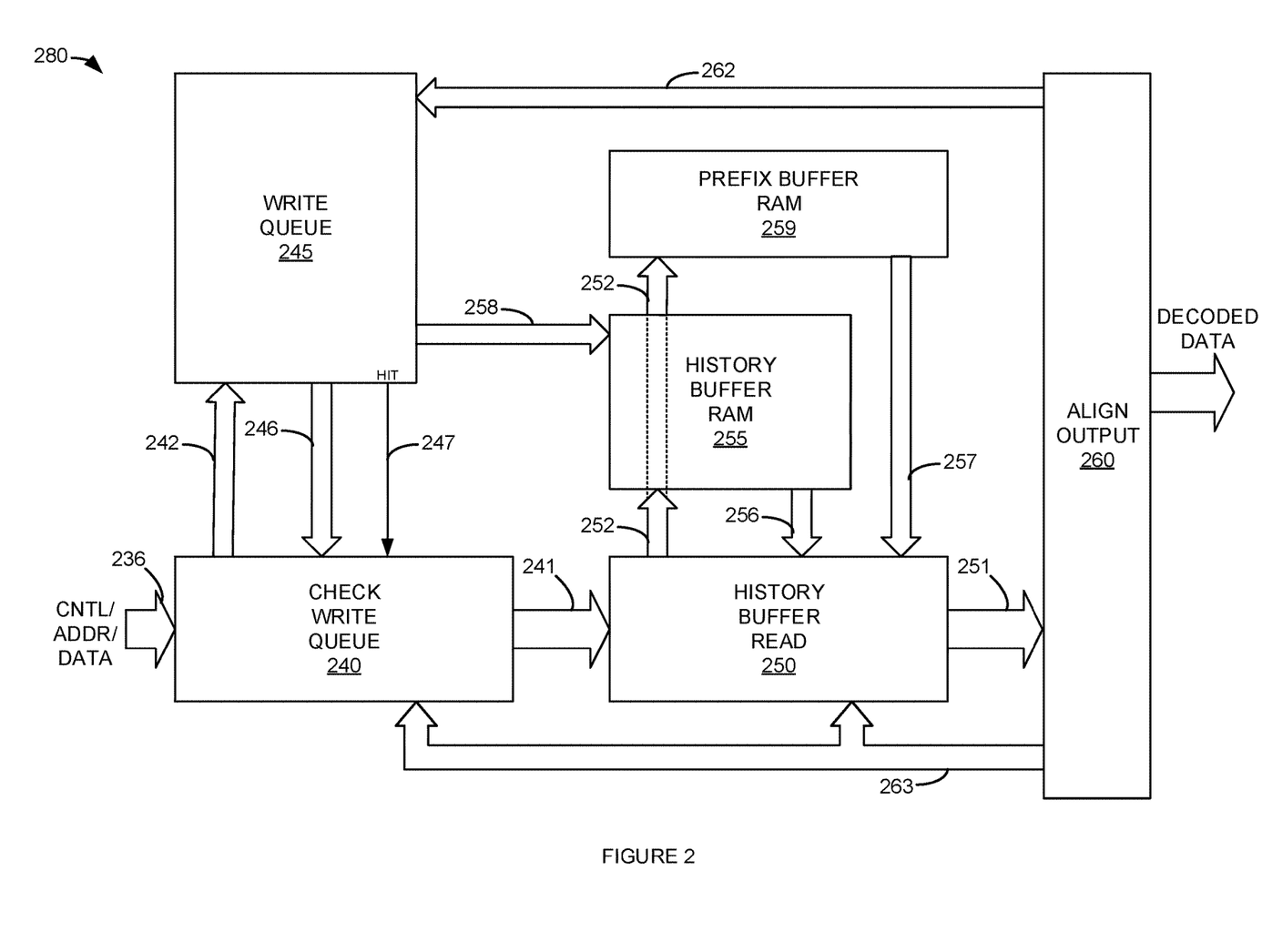
FIG. 2 is a block diagram illustrating data decompression pipeline stages that maintain a history buffer memory.

FIG. 2 is a block diagram illustrating data decompression pipeline stages that maintain a history buffer memory. Backreference stages 280 may correspond to backreference stages 180 of system 100. Backreference stages 280 includes check write queue 240, history buffer read 250, write queue 245, history buffer random access memory (RAM) 255, prefix buffer RAM 255, and align output 260.

Check write queue 240 receives control signals, backreference addresses, and literal data 236 from the previous stage in the pipeline. Check write queue 240 queries write queue 245 by sending backreference address 242 to write queue 245. If the data corresponding to backreference address 242 is present in write queue 245, write queue 245 responds with a hit signal 247 and the data 246 corresponding to the backreference address 242. Check write queue 240 provides data 246 (if any) read from right queue 245 to history buffer read 250. Check write queue 240 forwards control signals back reference addresses and literal data to history buffer read 250. This is illustrated in FIG. 2 by arrow 241.

In an embodiment, history buffer RAM is banked (e.g., 2 banks) to minimize collisions that occur when the same bank is required to be accessed for read and write on a single ported RAM. Write queue 245 delays writes to History buffer RAM 255. Write queue 245 is checked by check write queue 240 for read operations before history buffer read 250 accesses history buffer RAM 255. This mechanism essentially prioritizes reads over writes to reduce pipeline stalls. In an embodiment, the only time the pipe stalls is when write queue 245 is full and the oldest entry needs to be written out to history buffer RAM 255 before a new entry can be inserted into write queue 245.

In an embodiment, write queue 245 uses of lower bits of address 242 to address the entries in write queue 245. This allows a single entry to be compared by write queue 245 for write queue 245 hits during reads—thus eliminating the need for a content addressable memory or complicated multi-way tag lookups.

If the data corresponding to the backreference address 242 was not found in write queue 245, history buffer read 250 sends the backreference address 252 to history buffer RAM 255 or prefix buffer RAM 259. In an embodiment, if backreference address 252 is a positive number, history buffer read 250 accesses history buffer RAM 255 for data 256 corresponding to the backreference address 252. If backreference address 252 is a negative number, history buffer read 250 accesses prefix buffer RAM 259 for data 257 corresponding to the backreference address 252. History buffer read 250 forwards control signals data 246 (if any), data 256 (if any), data 257 (if any) and literal data (if any) to align output 260. This is illustrated in FIG. 2 by arrow 251.

In an embodiment, a one byte read and a one byte write operation are required per output byte. Since this cannot be achieved per cycle using a single ported RAM, history buffer RAM 255 may be implemented as a multi-bank memory (e.g., two banks) that are eight bytes wide each. This forces the reads and writes in the same cycle to target different banks so they can be operated in parallel.

Align output 260 combines results of reads from write queue 245, history buffer RAM 255, or prefix buffer RAM 255 with the literals that have been passed through the previous pipeline stages to form a block of aligned/ordered output data. The ordered output data is also forwarded by align output 260 to write queue 245 via bus 262 so it may be written to the history buffer RAM 255 at a later time. When a cycle is available (or when write queue 245 is full), write queue 245 writes the oldest data it holds into history buffer RAM 255 via bus 258.

Prefix buffer RAM 259 stores predefined prefix data. Predefined prefix data consists of pre-computed blocks of data that are pre-loaded into prefix buffer RAM 259. This predefined prefix data can be backreferenced by the input data stream to improve compression efficiency—particularly of small files. Predefined prefix data may comprise, for example, 1 kB blocks of predefined data. Prefix data may be loaded into prefix buffer RAM 259 during the 'header decode phase' of the next block (i.e., while the current block is still being decoded) so that the prefix data for the next block of input data is ready to be used when the actual input stream data for that block is available. This essentially allows for low or zero cycle latency loading of predefined prefix data.

Align output 260 may also provide data directly to check write queue 240 and/or history buffer read 250 via bus 263. Align output 260 provides this data in order to override any read data that is written by operations that are ahead in the pipeline (e.g., in history buffer read 250 and/or align output 260.) The read data 246 from write queue 245 is replaced by the data from align output 260 if the read address 242 equals the data forwarding address. The read data 256 from history buffer RAM 255 is replaced by the data from align output 260 if the read address 252 equals the data forwarding address.

Figure 3:
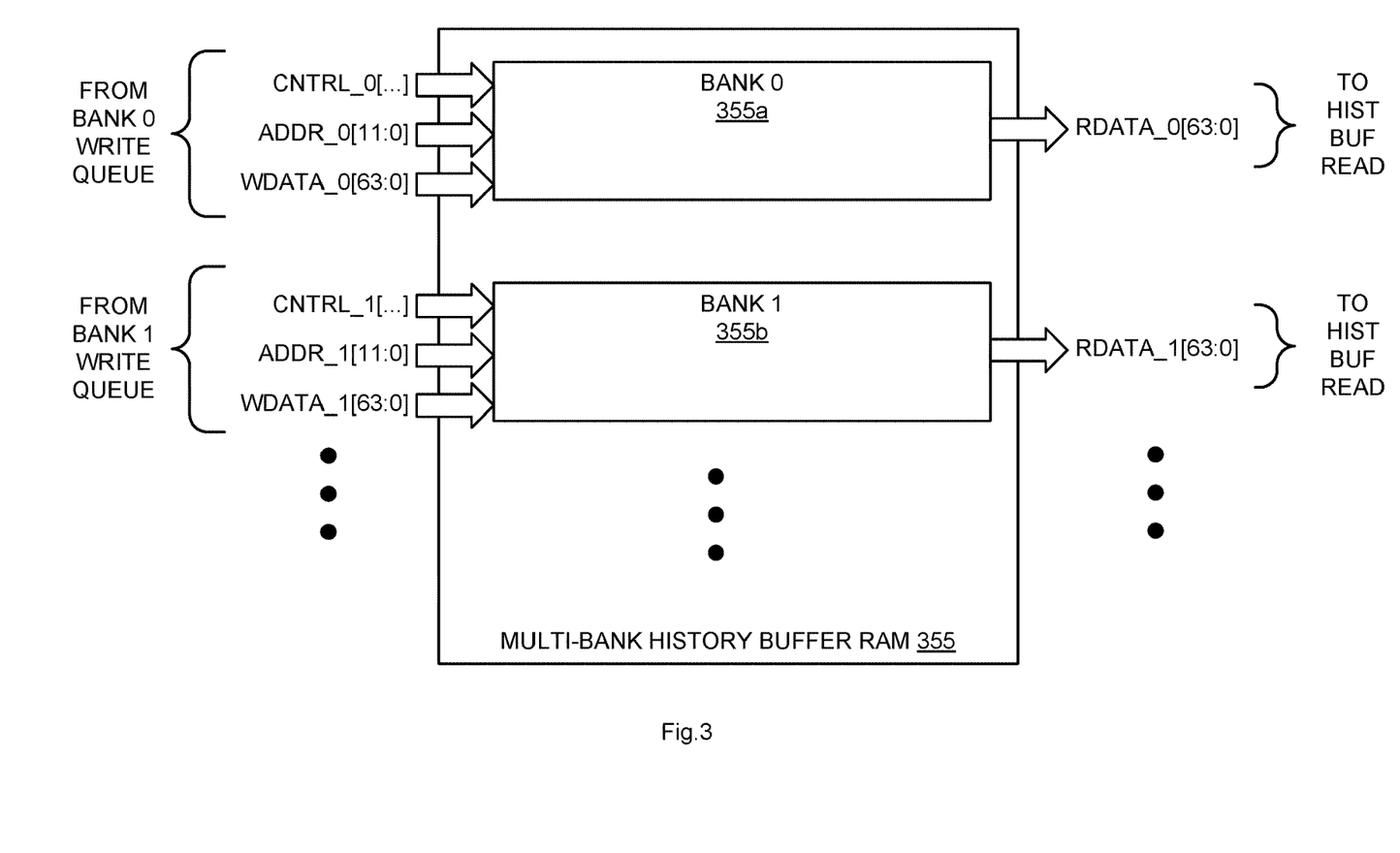
FIG. 3 is a block diagram illustrating a multi-bank history buffer memory.

FIG. 3 is a block diagram illustrating a multi-bank history buffer memory. Multi-bank history buffer RAM 355 may be an example of history buffer RAM 255. Multi-bank history buffer RAM 355 includes at least single-ported bank 0 355*a* and single-ported bank 1 355*b*. Bank 0 355*a* receives, from a write queue (e.g., write queue 245), control signals (e.g., CNTRL_0[ . . . ]), address signals (e.g., ADDR_0[11:0], and write data (e.g., WDATA_0[63:0]). Bank 0 355*a* provides data (e.g., RDATA_0[63:0] read from an array of memory cells to a history buffer read pipeline stage (e.g., history buffer read 250). Bank 1 355*b* receives, from the write queue, control signals (e.g., CNTRL 1[ . . . ]), address signals (e.g., ADDR_1[11:0], and write data (e.g., WDATA_1[63:0]). Bank 1 355*b* provides data (e.g., RDATA_1[63:0] read from an array of memory cells to a history buffer read pipeline stage (e.g., history buffer read 250). Additional banks may be present in multi-bank history buffer RAM 355 but are omitted herein for the sake of brevity.

Figure 4:
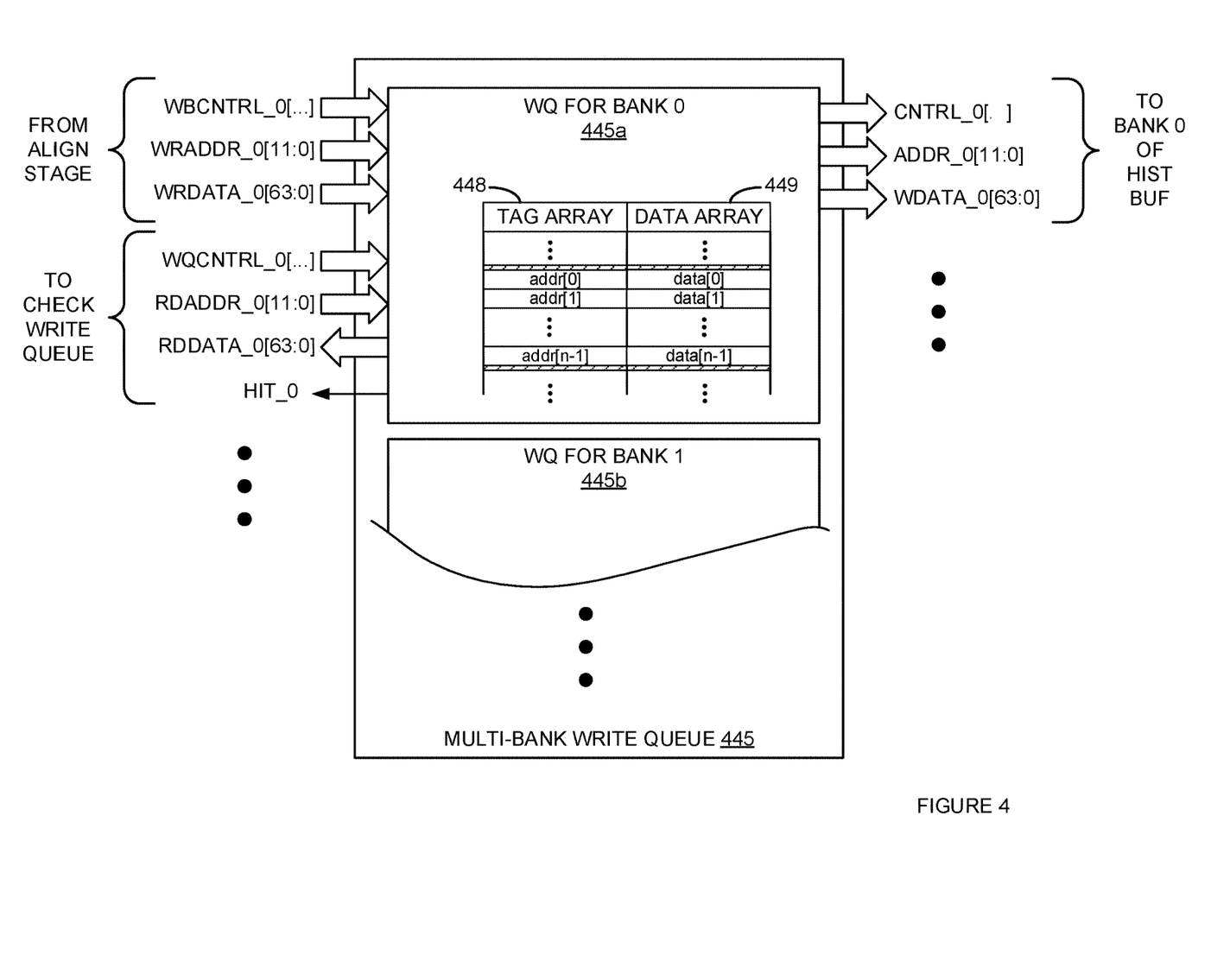
FIG. 4 is a block diagram illustrating a write queue for a multi-bank history buffer memory.

FIG. 4 is a block diagram illustrating a write queue for a multi-bank history buffer memory. Multi-bank write queue 445 may be an example of write queue 245. Write queue for bank 0 445*a* receives, from an align output stage (e.g., align output 260), control signals (e.g., WBCNTRL_0[ . . . ]), write address signals (e.g., WBADDR_0[11:0], and write data (e.g., WRDATA_0[63:0]). Write queue for bank 0 445*a* also receives, from a check write queue stage (e.g., check write queue 240), control signals (e.g., WQCNTRL_0[ . . . ]), read address signals (e.g., RDADDR_0[11:0].) In response to these control and read address signals, write queue for bank 0 445*a* outputs read data (e.g., RDDATA_0[63:0]) and a hit indicator. The hit indicator communicates, to the check write queue stage, that the read address signals correspond to data that is being stored in write queue for bank 0 445*a*. In an embodiment, write queue for bank 0 445*a* may include a tag array 448 and a data array 449. Write queue for bank 0 445*a* also provides control signals (e.g., CNTRL_0[ . . . ]), write address signals (e.g., ADDR_0[11:0]) and write data (e.g., WDATA_0[63:0]) to a corresponding (e.g., bank 0) bank of a history buffer memory (e.g., bank 0 355*a* of history buffer RAM 355.)

Figure 5:
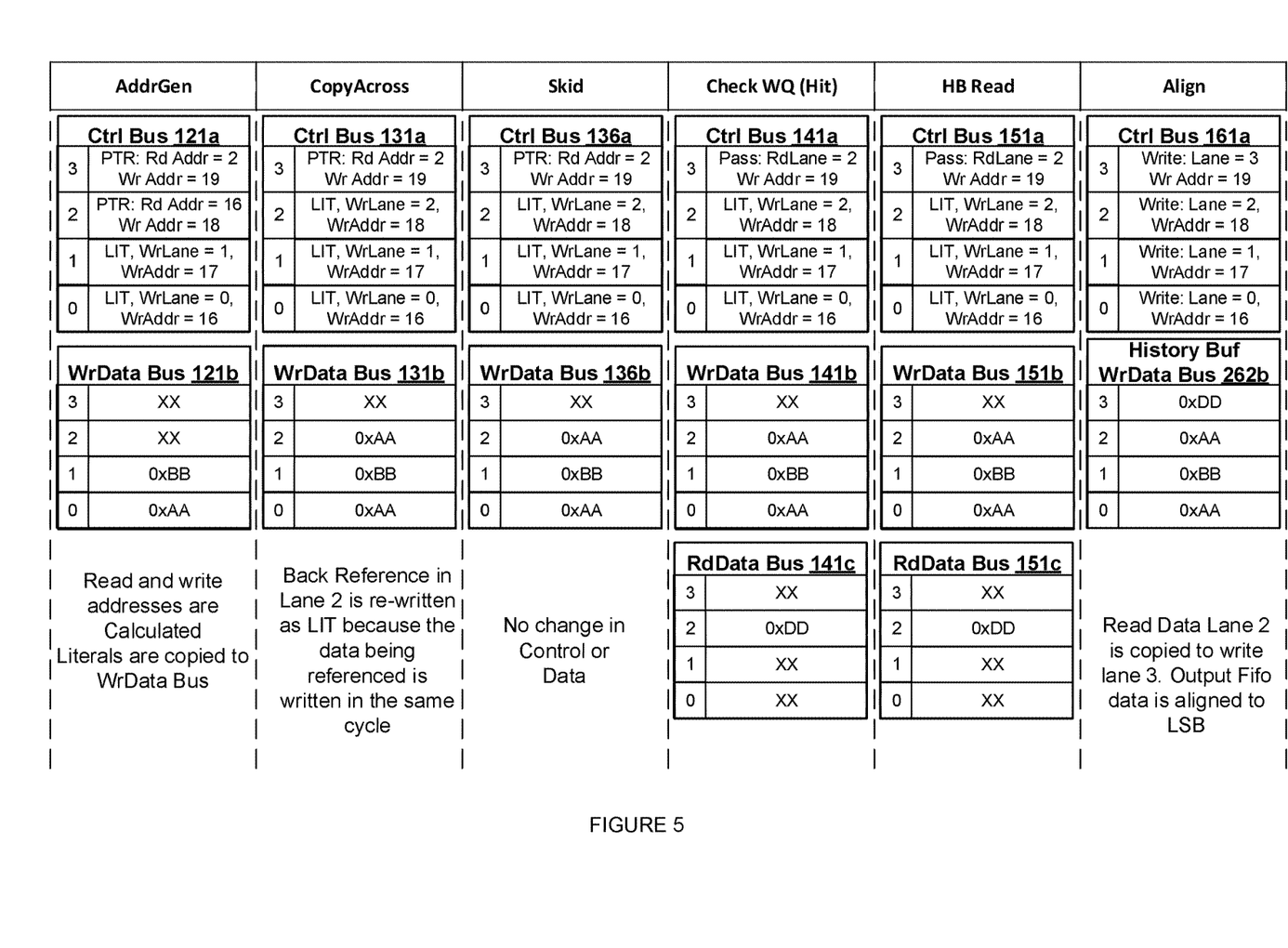
FIG. 5 illustrates the operation of decompression pipeline stages when there is a write queue hit.

FIG. 5 illustrates the operation of decompression pipeline stages when there is a write queue hit. In FIG. 5, example values on busses output by each stage are illustrated. Each bus is divided into lanes. A lane is a grouping of signals that are associated with an atomic data unit (e.g., byte for a byte based compression scheme) being decompressed/decoded by the pipeline. FIG. 5 follows a single set of symbols being decoded through the pipeline stages from left to right.

In FIG. 5, the address generation (AddrGen) stage (e.g., address generation 120) outputs, on control bus 121*a*, indicators that lane 0: (a) is processing/passing a literal symbol; (b) lane 0 will be where that literal will be output at the end of the pipeline; and (c) the address in the history buffer memory where this literal will be written is location number 16. AddrGen also output indicators that lane 1: (a) is processing/passing a literal symbol; (b) lane 1 will be where that literal will be output; and (c) the address in the history buffer memory where this literal will be written is location number 17. AddrGen also output indicators that lane 2: (a) is processing/passing a backreference (PTR) symbol; (b) the address in the history buffer memory where the byte needs to be read from is location 16; and (c) the address in the history buffer memory where the backreferenced byte will be written is location number 18. AddrGen also output indicators that lane 3: (a) is processing/passing a backreference (PTR) symbol; (b) the address in the history buffer memory where the byte needs to be read from is location 2; and (c) the address in the history buffer memory where the backreferenced byte will be written is location number 19. AddrGen also outputs, on write data bus 121*b*, in corresponding lanes (i.e., lane 0 and lane 1) the values of the literals being processed by those lanes.

CopyAcross stage (e.g., Copy across 130) outputs, on control bus 131*a*, indicators that lane 0: (a) is processing/passing a literal symbol; (b) lane 0 will be where that literal will be output at the end of the pipeline; and (c) the address in the history buffer memory where this literal will be written is location number 16. CopyAcross also output indicators that lane 1: (a) is processing/passing a literal symbol; (b) lane 1 will be where that literal will be output; and (c) the address in the history buffer memory where this literal will be written is location number 17. CopyAcross also output indicators that lane 2: (a) is now processing/passing a literal symbol (changed from the PTR output by AddrGen); (b) lane 2 will be where that literal will be output at the end of the pipeline; and (c) the address in the history buffer memory where this literal will be written is location number 18. CopyAcross also output indicators that lane 3: (a) is processing/passing a backreference (PTR) symbol; (b) the address in the history buffer memory where the byte needs to be read from is location 2; and (c) the address in the history buffer memory where the backreferenced byte will be written is location number 19. CopyAcross also outputs, on write data bus 131*b*, in corresponding lanes (i.e., lane 0, lane 1, and lane 2) the respective values of the literals (0xAA, 0xBB, 0xAA) being processed by those lanes. Since the skid stage is to help prevent timing propagation from pipeline stalls, no change to the values being communicated on control bus 131*a* and write data bus 131*b* are made by skid stage and the same values, given herein, are output by skid stage on control bus 136*a* and 136*b*.

Check write queue (check WQ) stage (e.g., check write queue 140) outputs, on read bus 141*c*, indicators that there was a hit in the write queue and that the value for the backreference read from the write queue (0xDD) is on lane 2 of the read data bus 141*c*. Because there was hit in the write queue, the history buffer read does not alter the outputs being passed through the pipeline.

Finally, the align output (Align) stage (e.g., align output stage 160) copies the data on lane 2 of the read data bus 151*c* to lane 3 of the write data bus 262*b*. Align also outputs, on control bus 161*a*, indicators that the value on write data bus lane 0 should be written to location 16; the value on write data bus lane 1 should be written to location 17, the value on write data bus lane 2 should be written to location 18, and the value on write data bus lane 3 should be written to location 19. The write data bus 262*b* has the value 0xAA on lane 0, 0xBB on lane 1, 0xAA on lane 2, and 0xDD on lane 3.

Figure 6:
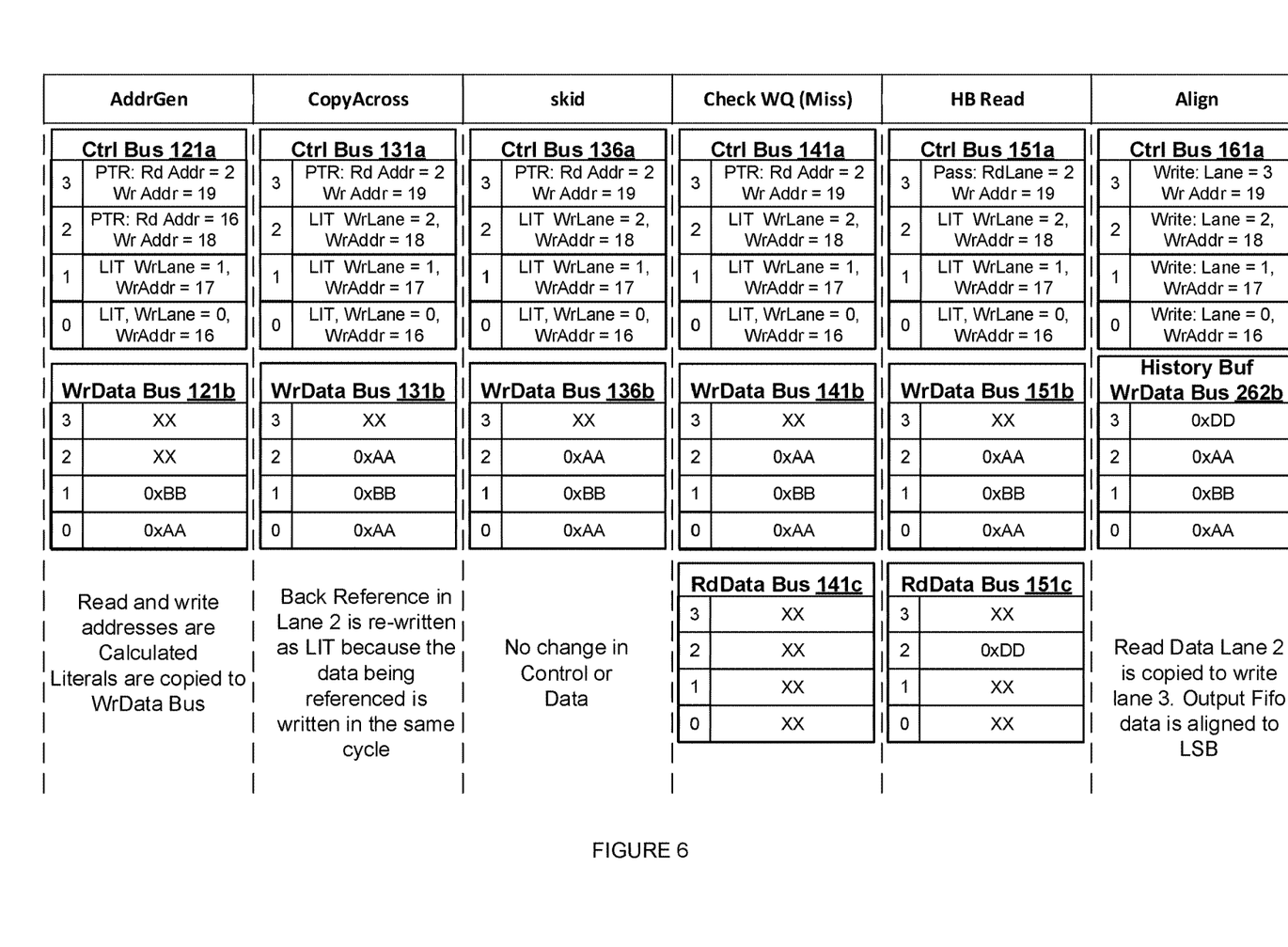
FIG. 6 illustrates the operation of decompression pipeline stages when there is a write queue miss.

FIG. 6 illustrates the operation of decompression pipeline stages when there is a write queue miss. The values output by each pipeline stage illustrated in FIG. 6 are similar to FIG. 5 except, because there was a miss in the write queue, the value 0xDD is read from the history buffer memory by history buffer read stage and placed in lane 2 of read data bus 151*c* (rather than being placed in lane 2 of read data bus 141*c* by check write queue). In addition, at the output of the check write queue stage (miss) lane 3: (a) is processing/passing a backreference (PTR) symbol; (b) the address in the history buffer memory where the byte needs to be read from is location 16.

Figure 7:
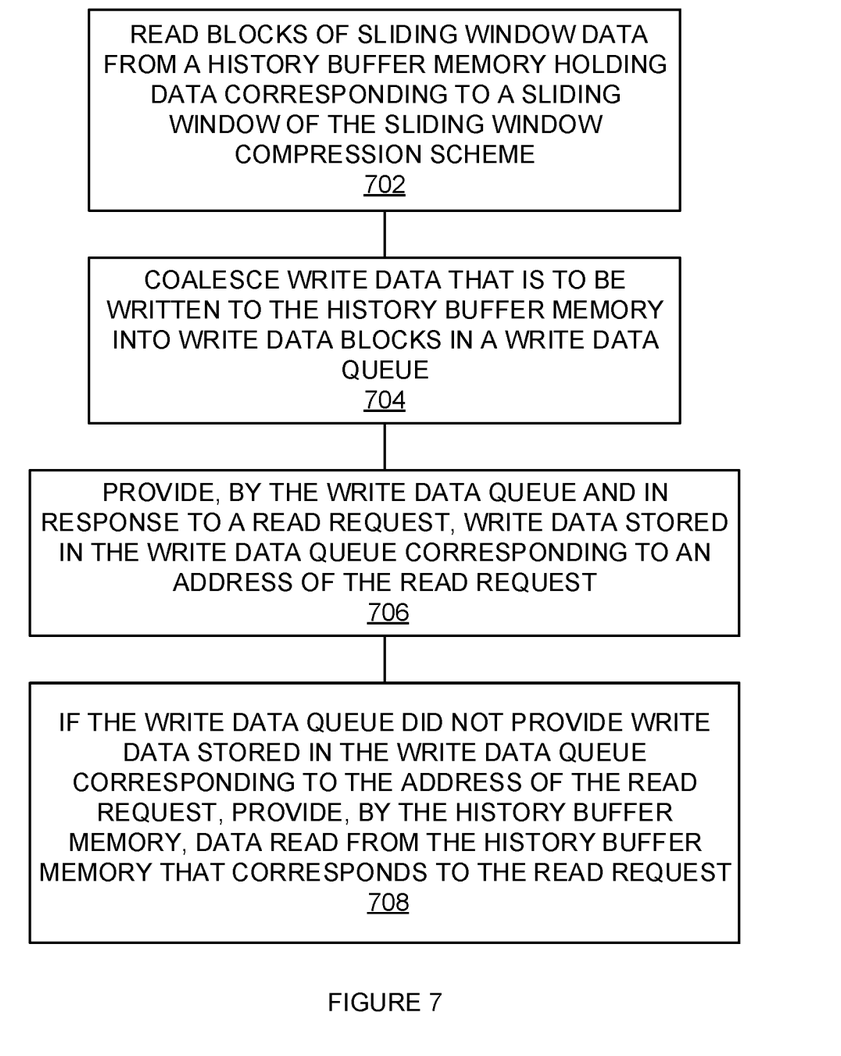
FIG. 7 is a flowchart illustrating a method of accessing a history buffer memory.

FIG. 7 is a flowchart illustrating a method of accessing a history buffer memory. The steps illustrated in FIG. 7 may be performed by one or more elements of system 100 and/or stages 280. Blocks of sliding window data are read from a history buffer memory holding data corresponding to a sliding window data compression scheme (702). For example, history buffer read 250 may read blocks (e.g., 8 bytes) of history buffer data from history buffer RAM 255.

Write data that is to be written to the history buffer memory are coalesced into write data blocks in a write data queue (704). For example, align output 260 may control write queue 245 to coalesce output bytes into blocks of data that will later (i.e., when there is an available cycle) be written to history buffer RAM 255. By the write data queue and in response to a read request, write data stored in the write data queue corresponding to an address of the read request is provided (706). For example, write queue 245 may, in response to a read address 242 from check write queue 240, provide read data 246 to check write queue 240. Check write queue 240 may forward this read data 246 to the next stage in the pipeline (i.e., history buffer read 250 and/or align output 260)

If the write data queue did not provide write data stored in the write data queue corresponding to the address of the read request, data read from the history buffer memory that corresponds to the read request is provided (708). For example, if there is a miss in the write queue 245 for the data corresponding to address 242, history buffer read may request that data from history buffer RAM 255 and then provide data 256 to the next stage in the pipeline (i.e., align output 260).

Figure 8:
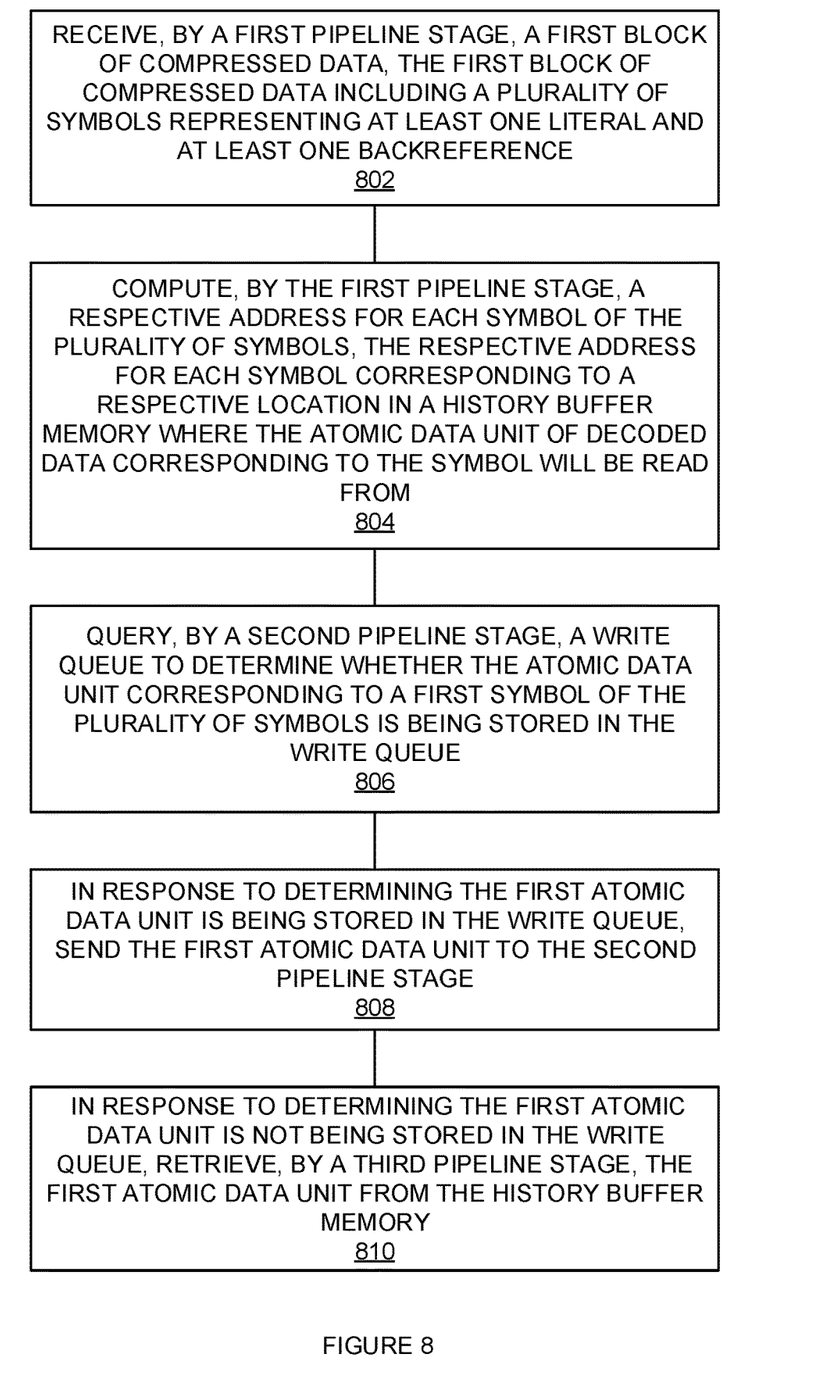
FIG. 8 is a flowchart illustrating a method of operating a decompression pipeline.

FIG. 8 is a flowchart illustrating a method of operating a decompression pipeline. The steps illustrated in FIG. 8 may be performed by one or more elements of system 100 and/or stages 280. By a first pipeline stage, a first block of compressed data is received, where the first block of compressed data includes a plurality of symbols representing at least one literal and at least one backreference (802). For example, address generation stage 120 may receive, from launch 110, indicators and/or symbols corresponding to literals and/or backreferences of LZ compressed data. It should be understood that, some blocks of compressed data may include no literals or no backreferences.

By the first pipeline stage, a respective address for each symbol of the plurality of symbols are computed where the respective address for each symbol corresponds to a respective location in a history buffer memory where the atomic data unit of decoded data corresponding the symbol is stored (804). For example, address generation stage 120 may compute the locations, in history buffer memory 255, where the byte corresponding to a backreference symbol in the input lanes to address generation stage 120 is to be read from.

By a second pipeline stage, a write queue is queried to determine whether the atomic data unit corresponding to a first symbol of the plurality of symbol is being stored in the write queue (806). For example, check write queue 240 may query write queue 245 to determine whether write queue 245 is holding a data byte required to process a backreference symbol. The location/address 242 write queue 245 is queried about may have been calculated by address generation stage 120.

In response to determining the first atomic data unit is being stored in the write queue, the first atomic data unit is sent to the second pipeline stage (808). For example, in response to a hit in write queue 245, check write queue 240 may send the data 246 to check write queue 240. In response to determining the first atomic data unit is not being stored in the write data queue, the first atomic data unit is retrieved by a third pipeline stage for the history buffer memory (810). For example, in response to a miss in write queue 245, history buffer read 250 may retrieve, from history buffer RAM 255, the data byte (as part of a larger block of data) required to process a backreference symbol.

Figure 9:
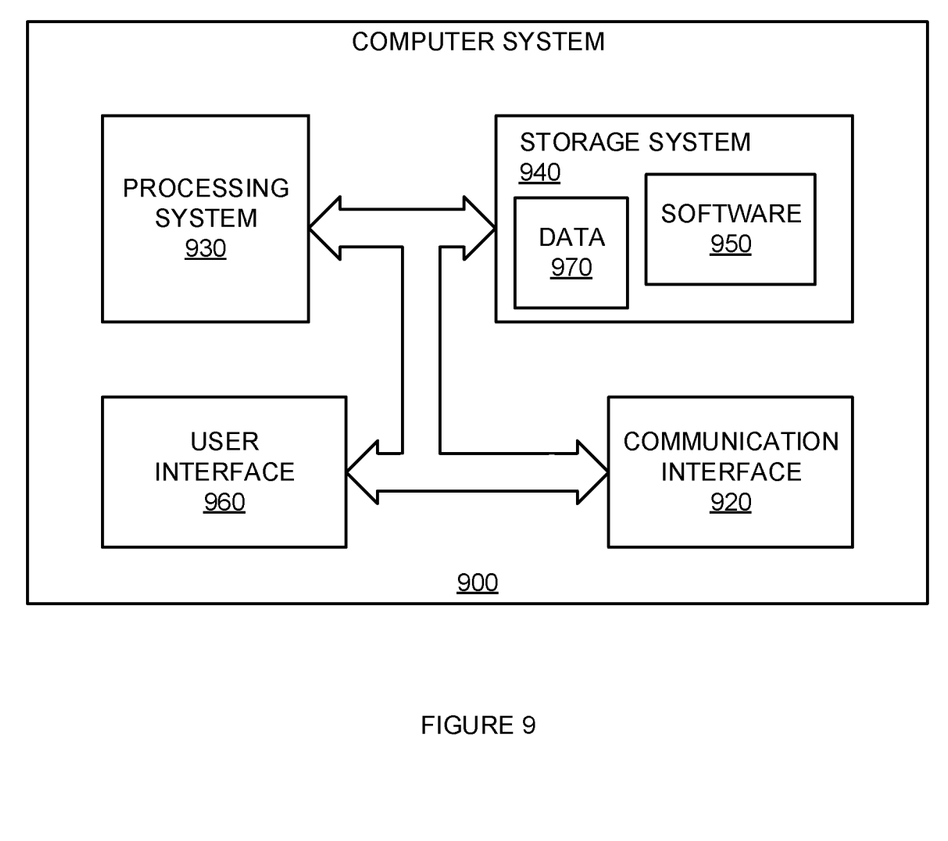
FIG. 9 is a block diagram of a computer system.

FIG. 9 is a block diagram of a computer system. In an embodiment, computer system 900 and/or its components include circuits, software, and/or data that implement, or are used to implement, the methods, systems and/or devices illustrated in the Figures, the corresponding discussions of the Figures, and/or are otherwise taught herein.

The methods, systems and devices described herein may be implemented in computer systems, or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of decompression system 100, and its components. These software descriptions may be: behavioral, register transfer, logic component, transistor, and layout geometry-level descriptions.

Data formats in which such descriptions may be implemented are stored on a non-transitory computer readable medium include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Physical files may be implemented on non-transitory machine-readable media such as: 4 mm magnetic tape, 8 mm magnetic tape, 3½-inch floppy media, CDs, DVDs, hard disk drives, solid-state disk drives, solid-state memory, flash drives, and so on.

Alternatively, or in addition, the functionally described herein can be performed, at least in part, by one or more hardware logic components. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), multi-core processors, graphics processing units (GPUs), etc.

FIG. 9 is a block diagram of a computer system. In an embodiment, computer system 900 and/or its components include circuits, software, and/or data that implement, or are used to implement, the methods, systems and/or devices illustrated in the Figures, the corresponding discussions of the Figures, and/or are otherwise taught herein.

Computer system 900 includes communication interface 920, processing system 930, storage system 940, and user interface 960. Processing system 930 is operatively coupled to storage system 940. Storage system 940 stores software 950 and data 970. Processing system 930 is operatively coupled to communication interface 920 and user interface 960. Storage system 940 and/or communication interface 920 are examples of a subsystems that may include system 100, stages 280, their components, and/or an integrated circuit including system 100, stages 280, and/or their components.

Computer system 900 may comprise a programmed general-purpose computer. Computer system 900 may include a microprocessor. Computer system 900 may comprise programmable or special purpose circuitry. Computer system 900 may be distributed among multiple devices, processors, storage, and/or interfaces that together comprise elements 920-970.

Communication interface 920 may comprise a network interface, modem, port, bus, link, transceiver, or other communication device. Communication interface 920 may be distributed among multiple communication devices. Processing system 930 may comprise a microprocessor, microcontroller, logic circuit, or other processing device. Processing system 930 may be distributed among multiple processing devices. User interface 960 may comprise a keyboard, mouse, voice recognition interface, microphone and speakers, graphical display, touch screen, or other type of user interface device. User interface 960 may be distributed among multiple interface devices. Storage system 940 may comprise a disk, tape, integrated circuit, RAM, ROM, EEPROM, flash memory, network storage, server, or other memory function. Storage system 940 may include computer readable medium. Storage system 940 may be distributed among multiple memory devices.

Processing system 930 retrieves and executes software 950 from storage system 940. Processing system 930 may retrieve and store data 970. Processing system 930 may also retrieve and store data via communication interface 920. Processing system 950 may create or modify software 950 or data 970 to achieve a tangible result. Processing system may control communication interface 920 or user interface 960 to achieve a tangible result. Processing system 930 may retrieve and execute remotely stored software via communication interface 920.

Software 950 and remotely stored software may comprise an operating system, utilities, drivers, networking software, and other software typically executed by a computer system. Software 950 may comprise an application program, applet, firmware, or other form of machine-readable processing instructions typically executed by a computer system. When executed by processing system 930, software 950 or remotely stored software may direct computer system 900 to operate as described herein.

Implementations discussed herein include, but are not limited to, the following examples:

Example 1

An integrated circuit for decompressing a sliding window compression scheme, comprising: a history buffer memory to hold data corresponding to a sliding window of the sliding window compression scheme, the history buffer memory including a plurality of single-ported memory banks, each of the plurality of single-ported memory banks configured so that at most one of a read or write operation is performed concurrently by a respective single-ported memory bank; a write queue to receive write data to be written to the history buffer memory, the write queue to coalesce a plurality of write operations to reduce write operations made to the plurality of single-ported memory banks, the write queue to respond to read operations with corresponding data that is waiting in the write queue to be written to the history buffer memory, the history buffer memory not to be read for the corresponding data if the write queue responds with the corresponding data.

Example 2

The integrated circuit of example 1, further comprising: a check write queue pipeline stage to query the write queue with read operations for corresponding data waiting in the write queue.

Example 3

The integrated circuit of example 2, wherein the check write queue pipeline stage is to receive, in response to a read operation presented to the write queue, data that is waiting in the write queue to be written to the history buffer memory.

Example 4

The integrated circuit of example 3, wherein the check write queue pipeline stage is to also receive write data corresponding to write operations to the history buffer memory that are performed by a later pipeline stage.

Example 5

The integrated circuit of example 4, further comprising: a history buffer read pipeline stage to receive data read from the history buffer memory.

Example 6

The integrated circuit of example 5, wherein the history buffer read pipeline stage is to also receive write data corresponding to write operations to the history buffer memory that are performed by the later pipeline stage.

Example 7

The integrated circuit of example 6, further comprising: a prefix buffer to provide precomputed history data to be used as data corresponding to at least part of the sliding window of the sliding window compression scheme.

Example 8

The integrated circuit of example 6, wherein the history buffer read pipeline stage is to also receive the precomputed history data.

Example 9

A method of maintaining sliding window data for decompressing a sliding window compression scheme, comprising: reading blocks of sliding window data from a history buffer memory holding data corresponding to a sliding window of the sliding window compression scheme, the history buffer memory including a plurality of single-ported memory banks, each of the plurality of single-ported memory banks configured so that at most one of a reading of a first block of sliding window data and a writing of a second block of sliding window data can be performed concurrently by a respective single-ported memory bank; coalescing write data in a write data queue to be written to the history buffer memory in write data blocks; providing, by the write data queue and in response to a read request, write data stored in the write data queue corresponding to an address of the read request; if the write data queue did not provide write data stored in the write data queue corresponding to the address of the read request, providing, by the history buffer memory, data read from the history buffer memory that corresponds to the read request.

Example 10

The method of example 9, wherein a write queue check pipeline stage receives, from a previous pipeline stage, the address of the read request.

Example 11

The method of example 10, wherein the write queue check pipeline stage provides the address of the read request to the write data queue.

Example 12

The method of example 11, further comprising: receiving, by the write queue check pipeline stage, the write data stored in the write data queue corresponding to the address of the read request.

Example 13

The method of example 12, further comprising: receiving, by a history buffer read pipeline stage, data read from the history buffer memory that corresponds to the read request.

Example 14

The method of example 13, further comprising: receiving, by the history buffer read pipeline stage, precomputed history data that corresponds to the read request.

Example 15

The method of example 11, further comprising: receiving, by the write queue check pipeline stage, precomputed history data that corresponds to the read request.

Example 16

A method of decompressing data compressed according to a sliding window compression scheme, comprising: receiving, by a first pipeline stage, a first block of compressed data, the first block of compressed data including a plurality of symbols representing at least one literal and at least one backreference; computing, by the first pipeline stage, a respective address for each symbol of the plurality of symbols, the respective address for each symbol corresponding to a respective location in a history buffer memory where a respective atomic data unit associated with the respective symbol is to be read from in the history buffer memory, the history buffer memory storing a first sliding window of atomic data units that have been previously decoded; querying, by a second pipeline stage, a write queue to determine whether a first atomic data unit corresponding to a first symbol of the plurality of symbols is being stored in the write queue; in response to determining the first atomic data unit is being stored in the write queue, sending the first atomic data unit to the second pipeline stage; in response to determining the first atomic data unit is not being stored in the write queue, retrieving, by a third pipeline stage, the first atomic data unit from the history buffer memory.

Example 17

The method of example 16, further comprising: determining a second atomic data unit corresponding to a second symbol of the plurality of symbols is not stored in the write queue and is not stored in the history buffer memory; in response to determining the second atomic data unit is not being stored in the write queue and is not stored in the history buffer memory, receiving, by the second pipeline stage and from a fourth pipeline stage, the second atomic data unit; in response to determining the second atomic data unit is not being stored in the write queue and is not stored in the history buffer memory, providing the second atomic data unit received from the fourth pipeline stage to the third pipeline stage.

Example 18

The method of example 16, further comprising: determining a second atomic data unit corresponding to a second symbol of the plurality of symbols is not stored in the write queue and is not stored in the history buffer memory; in response to determining the second atomic data unit is not being stored in the write queue and is not stored in the history buffer memory, receiving, by the third pipeline stage and from a fourth pipeline stage, the second atomic data unit; in response to determining the second atomic data unit is not being stored in the write queue and is not stored in the history buffer memory, providing the second atomic data unit received from the fourth pipeline stage to the fourth pipeline stage.

Example 19

The method of example 16, further comprising: determining a second atomic data unit corresponding to a second symbol of the plurality of symbols is stored in a prefix buffer that stores a set of atomic data units corresponding to precomputed atomic data units in at least part of a second sliding window of atomic data units; in response to determining the second atomic data unit is stored in the prefix buffer, receiving, by the third pipeline stage and from the prefix buffer, the second atomic data unit.

Example 20

The method of example 20, further comprising: in response to determining the second atomic data unit is stored in the prefix buffer, providing the second atomic data unit received from the prefix buffer to a fourth pipeline stage.

The foregoing descriptions of the disclosed embodiments have been presented for purposes of illustration and description. They are not intended to be exhaustive or to limit the scope of the claimed subject matter to the precise form(s) disclosed, and other modifications and variations may be possible in light of the above teachings. The embodiments were chosen and described in order to best explain the principles of the disclosed embodiments and their practical application to thereby enable others skilled in the art to best utilize the various embodiments and various modifications as are suited to the particular use contemplated. It is intended that the appended claims be construed to include other alternative embodiments except insofar as limited by the prior art.

What is claimed is:

1. An integrated circuit for decompressing a sliding window compression scheme, comprising:
a history buffer memory to hold data corresponding to a sliding window of the sliding window compression scheme, the history buffer memory including a plurality of single-ported memory banks, each of the plurality of single-ported memory banks configured so that at most one of a read or write operation is performed concurrently by a respective single-ported memory bank;
a write queue to receive write data forming a subset of data corresponding to read addresses to be written to the history buffer memory, the write queue to coalesce a plurality of write operations to reduce write operations made to the plurality of single-ported memory banks, the write queue to respond to read operations with corresponding data that is waiting in the write queue to be written to the history buffer memory, the history buffer memory not to be read for the corresponding data in accordance with the write queue responding with the corresponding data.

2. The integrated circuit of claim 1, further comprising:
a check write queue pipeline stage to query the write queue with read operations for corresponding data waiting in the write queue.

3. The integrated circuit of claim 2, wherein the check write queue pipeline stage is to receive, in response to a read operation presented to the write queue, data that is waiting in the write queue to be written to the history buffer memory.

4. The integrated circuit of claim 3, wherein the check write queue pipeline stage is to also receive write data corresponding to write operations to the history buffer memory that are performed by a later pipeline stage.

5. The integrated circuit of claim 4, further comprising:
a history buffer read pipeline stage to receive data read from the history buffer memory.

6. The integrated circuit of claim 5, wherein the history buffer read pipeline stage is to also receive write data corresponding to write operations to the history buffer memory that are performed by the later pipeline stage.

7. The integrated circuit of claim 6, further comprising:
a prefix buffer to provide precomputed history data to be used as data corresponding to at least part of the sliding window of the sliding window compression scheme.

8. The integrated circuit of claim 7, wherein the history buffer read pipeline stage is to also receive the precomputed history data.

9. A method of maintaining sliding window data for decompressing a sliding window compression scheme, comprising:
reading blocks of sliding window data from a history buffer memory holding data corresponding to a sliding window of the sliding window compression scheme, the history buffer memory including a plurality of single-ported memory banks, each of the plurality of single-ported memory banks configured so that at most one of a reading of a first block of sliding window data and a writing of a second block of sliding window data can be performed concurrently by a respective single-ported memory bank;
coalescing write data forming a subset of data corresponding to read addresses in a write data queue to be written to the history buffer memory in write data blocks;
providing, by the write data queue and in response to a read request, write data stored in the write data queue corresponding to an address of the read request;
in accordance with the write data queue not providing write data stored in the write data queue corresponding to the address of the read request, providing, by the history buffer memory, data read from the history buffer memory that corresponds to the read request.

10. The method of claim 9, wherein a write queue check pipeline stage receives, from a previous pipeline stage, the address of the read request.

11. The method of claim 10, wherein the write queue check pipeline stage provides the address of the read request to the write data queue.

12. The method of claim 11, further comprising:
receiving, by the write queue check pipeline stage, the write data stored in the write data queue corresponding to the address of the read request.

13. The method of claim 12, further comprising:
receiving, by a history buffer read pipeline stage, data read from the history buffer memory that corresponds to the read request.

14. The method of claim 13, further comprising:
receiving, by the history buffer read pipeline stage, pre-computed history data that corresponds to the read request.

15. The method of claim 11, further comprising:
receiving, by the write queue check pipeline stage, pre-computed history data that corresponds to the read request.

16. A method of decompressing data compressed according to a sliding window compression scheme, comprising:
receiving, by a first pipeline stage, a first block of compressed data, the first block of compressed data including a plurality of symbols representing at least one literal and at least one backreference;
computing, by the first pipeline stage, a respective address for each symbol of the plurality of symbols, the respective address for each symbol corresponding to a respective location in a history buffer memory where a respective atomic data unit associated with a respective symbol is to be read from in the history buffer memory, the history buffer memory storing a first sliding window of atomic data units that have been previously decoded;
querying, by a second pipeline stage, a write queue to determine whether a first atomic data unit included in a subset of data received by the write queue and corresponding to a first symbol of the plurality of symbols is being stored in the write queue;
in response to determining the first atomic data unit is being stored in the write queue, sending the first atomic data unit to the second pipeline stage;
in response to determining the first atomic data unit is not being stored in the write queue, retrieving, by a third pipeline stage, the first atomic data unit from the history buffer memory.

17. The method of claim 16, further comprising:
determining a second atomic data unit corresponding to a second symbol of the plurality of symbols is not stored in the write queue and is not stored in the history buffer memory;
in response to determining the second atomic data unit is not being stored in the write queue and is not stored in the history buffer memory, receiving, by the second pipeline stage and from a fourth pipeline stage, the second atomic data unit;
in response to determining the second atomic data unit is not being stored in the write queue and is not stored in the history buffer memory, providing the second atomic data unit received from the fourth pipeline stage to the third pipeline stage.

18. The method of claim 16, further comprising:
determining a second atomic data unit corresponding to a second symbol of the plurality of symbols is not stored in the write queue and is not stored in the history buffer memory;
in response to determining the second atomic data unit is not being stored in the write queue and is not stored in the history buffer memory, receiving, by the third pipeline stage and from a fourth pipeline stage, the second atomic data unit;
in response to determining the second atomic data unit is not being stored in the write queue and is not stored in the history buffer memory, providing the second atomic data unit received from the fourth pipeline stage to the fourth pipeline stage.

19. The method of claim 16, further comprising:
determining a second atomic data unit corresponding to a second symbol of the plurality of symbols is stored in a prefix buffer that stores a set of atomic data units corresponding to precomputed atomic data units in at least part of a second sliding window of atomic data units;
in response to determining the second atomic data unit is stored in the prefix buffer, receiving, by the third pipeline stage and from the prefix buffer, the second atomic data unit.

20. The method of claim 19, further comprising:
in response to determining the second atomic data unit is stored in the prefix buffer, providing the second atomic data unit received from the prefix buffer to a fourth pipeline stage.

* * * * *